US010831936B2

(12) United States Patent
Erdman et al.

(10) Patent No.: US 10,831,936 B2
(45) Date of Patent: Nov. 10, 2020

(54) VIRTUAL DESIGN

(71) Applicant: Regents of the University of Minnesota, Minneapolis, MN (US)

(72) Inventors: Arthur G. Erdman, New Brighton, MN (US); Daniel F. Keefe, St. Paul, MN (US); Dane Coffey, St. Paul, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 843 days.

(21) Appl. No.: 14/389,714

(22) PCT Filed: Mar. 15, 2013

(86) PCT No.: PCT/US2013/032614
§ 371 (c)(1),
(2) Date: Sep. 30, 2014

(87) PCT Pub. No.: WO2013/148369
PCT Pub. Date: Oct. 3, 2013

(65) Prior Publication Data
US 2015/0057982 A1 Feb. 26, 2015

Related U.S. Application Data

(60) Provisional application No. 61/618,303, filed on Mar. 30, 2012.

(51) Int. Cl.
*A61B 17/74* (2006.01)
*G06F 30/00* (2020.01)
(Continued)

(52) U.S. Cl.
CPC .............. *G06F 30/00* (2020.01); *G06T 13/00* (2013.01); *G06T 19/20* (2013.01)

(58) Field of Classification Search
CPC ...................................................... G06F 17/50
See application file for complete search history.

(56) References Cited

U.S. PATENT DOCUMENTS 8,224,632 B2   7/2012   Whirley et al.
2005/0210421 A1   9/2005   Smith et al.
(Continued)

FOREIGN PATENT DOCUMENTS

EP         1298596 A1      4/2003
WO    WO-2013148369 A1   10/2013

OTHER PUBLICATIONS

Daniel Keefe Rowe ("A Process for Design, Verification, Validation, and Manufacture of Medical Devices Using Immersive VR Environments" (Year: 2010).*

(Continued)

*Primary Examiner* — Doon Y Chow
*Assistant Examiner* — Abdou K Seye
(74) *Attorney, Agent, or Firm* — Schwegman Lundberg & Woessner, P.A.

(57) ABSTRACT

A system includes a user interface, a processor, and a memory. The user interface is configured to receive a user input and is configured to depict a first graphical representation of a device having a first configuration corresponding to a first simulation. The processor, coupled to the user interface, is configured to select a second simulation from a plurality of discrete simulations. The second simulation corresponds to the user input. The memory, coupled to the processor, is configured to store the plurality of discrete simulations. Each simulation includes device design parameters and corresponding performance parameters. The plurality of discrete simulations includes the first simulation and includes the second simulation. The processor is configured to generate a second graphical representation of the device having a second configuration and configured to (Continued)

depict the second graphical representation using the user interface. The second configuration is determined using the second simulation.

15 Claims, 6 Drawing Sheets

(51) Int. Cl.
    *G06T 19/20*      (2011.01)
    *G06T 13/00*      (2011.01)

(56) References Cited

U.S. PATENT DOCUMENTS

| | | | | |
|---|---|---|---|---|
| 2007/0124128 A1* | 5/2007 | Connacher | ............ | G09B 23/30 703/11 |
| 2009/0144173 A1* | 6/2009 | Mo | ........................ | G06N 3/006 705/26.1 |
| 2011/0029297 A1* | 2/2011 | Whirley | ................... | G06G 7/48 703/11 |
| 2012/0253756 A1* | 10/2012 | Favier | ................. | G06F 17/5009 703/2 |

OTHER PUBLICATIONS

"International Application Serial No. PCT/US2013/032614, International Preliminary Report on Patentability dated Oct. 9, 2014", 7 pgs.

Coffey, Dane, et al., "Interactive Slice WIM: Navigating and Interrogating Volume Datasets Using a Multi-Touch VR Interface", *IEEE Transactions on Visualization and Computer Graphics*, 18(10), (2012), 1614-1626.

Keefe, Daniel F., et al., "A Process for Design, Verification, Validation and Manufacture of Medical Devices Using Immersive VR Environments", *J. Med. Devices*, 4(4), (Dec. 2010), 6 pgs.

Keefe, Daniel F., et al., "Integrating Visualization and Interaction Research to Improve Scientific Workflows", *IEEE Computer Graphics and Applications*, (Mar./Apr. 2010), 6-11.

"Design by Dragging: An Interface for Creative Forward and Inverse Design with Simulation Ensembles", Final Draft Submitted to ACM SIGGRAPH, (Submitted Jan. 17, 2013), 8 pgs.

"International Application Serial No. PCT/US2013/032614, International Search Report dated May 28, 2013".

"International Application Serial No. PCT/US2013/032614, Written Opinion dated May 28, 2013".

\* cited by examiner

VIRTUAL DESIGN

CLAIM OF PRIORITY

This application is a U.S. National Stage Application filed under 35 U.S.C. § 371 from International Application Serial No. PCT/US2013/032614, which was filed Mar. 15, 2013, and published as WO 2013/148369 A1 on Oct. 3, 2013, and which claims the benefit of priority to U.S. Patent Application Ser. No. 61/618,303, filed Mar. 30, 2012, which applications and publication are incorporated by reference as if reproduced herein and made a part hereof in their entirety, and the benefit of priority of each of which is claimed herein.

BACKGROUND

Medical devices are fundamental to effective health care. Device examples include pacemakers, catheter delivery systems, and replacement heart valves. Medical devices affect patient care in both routine and in life-critical settings. Innovation in this field can have a direct positive impact on health outcomes. Despite the significant success of the medical device industry, devices still fail too often and the innovation process typical in medical device design, whether for refinement of existing devices or proposing radical new devices, is a slow, tedious process.

OVERVIEW

The present subject matter is directed to a system and method for virtual prototyping, design, verification, and manufacture of devices. The device can be a medical device or other type of device.

One example combines interactive supercomputing, interactive computer-based three dimensional data visualization and human-computer interfaces. The system enables engineering design tasks and includes accessing engineering and anatomy databases to transform modeling and simulation (M&S) as applied to medical device engineering tasks.

The present inventors have recognized, among other things, that a problem to be solved can include improving the design process for medical devices. The present subject matter can help provide a solution to this problem, such as by providing a data storage format that facilitates analysis of device configurations.

One example of the present subject matter includes an interactive platform with elements including a user interface, a processor, a memory device, and instructions for execution by the processor to implement an algorithm.

The user interface can include a module to receive two dimensional (2D) or three dimensional (3D) user manipulated inputs. The interface can include a display screen, a touch sensitive screen and in various examples, the interface can include a cursor controller (such as a mouse, a touch pad, a control wheel, or a keyboard). The interface can be configured to allow a user to select or control physical dimensions and material specifications, performance-type inputs (such as temperature limits, load capacity), and outputs (such as temperature profile, stress contour). One example allows a user to manipulate performance parameters such as input and output heat ranges, stress contours, structural loading, and other performance variables and the algorithm executed on a processor determines device design parameters that correspond with the specified performance parameter. A performance parameter can include a stress field or a temperature distribution.

A processor is configured to have capacity to deliver near real time calculations including finite element analysis (FEA), computational fluid dynamics (CFD), and other modeling software programs. In one example, the processor is configured to automatically access a variety of databases including those storing data concerning material properties, anatomy (including 2D and 3D imaging), physiology, model properties, and component properties. The processor can be configured to allow changes in one or more parameters from these data sets in substantially real time.

An anticipatory routine can be implemented using executable instructions in which an algorithm determines a next likely user inquiry based on current and historical patterns of user interaction. The processor can determine a solution based on pre-calculated values and during periods of low processing demand, the processor can execute a routine to determine a solution, or simulation, for a value not already stored in a database. In the absence of intermediary values, the processor is configured to snap to a pre-computed solution and provide performance results accordingly.

The various values can be organized in layers corresponding to different levels of analysis with an initial layer corresponding to a rather high level of summary (low resolution) and with passage of time, the processor is configured to further analyze and provide solutions corresponding to increased granularity and finer resolution. In one example, the processor is configured to receive analog inputs from a user manipulating a visual depiction of an element or performance data. The user can manipulate the screen or a table using hand or finger gestures.

One example includes user-selected solution resolution. The processor can be configured to automatically compute a new solution having a different, or enhanced, resolution in the background during periods of low processor loading or during periods of processor idle time.

Device configurations, including device design parameters and performance parameters, can be characterized in a particular data format for archival and review purposes. One example of a particular data format can be described as a wheel plot or a star plot. A particular device configuration can be expressed using a number of spokes with each spoke corresponding to a design parameter or performance parameter and the value of the parameter or performance measure can be depicted by a position along the length of the spoke. The data format can be viewed as a candidate device signature.

Data stored in a star plot format resembles a wheel having a plurality of spokes in which each spoke corresponds to a range having a first value (such as a minimum value) and a second value (such as a maximum value). In various examples, stored data can be expressed in a star plot, in parallel coordinates, and in other multidimensional data visualizations.

Data can be expressed in a plurality of star plots wherein the plots are aligned on a common axis. A cylindrical arrangement of star plots can be used to represent parameter spaces in which the depth (or length of the cylinder) represents another dimension. For example, the depth of a stack of star plots can correlate with a level of certainty, a level of resolution in a simulation, a time dimension, or other parameter.

A particular value or functional constraint on a value can be user-specified or be determined based on data associated with a particular model. For example, a user can lock a parameter to have a certain value or apply weighting to restrict flexibility. In addition, the user or a routine can specify those parameters that are free to move or impose a cost function with movement of a particular value.

An example of the present subject matter can be coupled to a CAD product design workstation. The present system and the CAD system can exchange data and expedite the device design process.

An example of the present subject matter can be coupled to a rapid-prototyping output device. The output device can be configured to generate a physical prototype based on a device signature or other characterization of a device generated by the processor. The physical prototype can be used for validation and verification (V&V) of the modeling and simulation.

An example of the present subject matter includes a tool for exploring large design spaces as encountered in simulation-based engineering, design of visual effects, and other tasks that entail tuning parameters of computationally intensive simulations and visually evaluating results.

One example integrates forward design via direct manipulation of simulation inputs (e.g., geometric properties, applied forces) in the same visual space with inverse design via dragging and reshaping simulation outputs (e.g., scalar fields from FEA or CFD computations). The tool uses algorithms for interpreting the intent of an input drag operation relative to parameterized models, morphing arbitrary scalar fields output from FEA and CFD simulations, and in-place interactive ensemble visualization. The inverse design strategy allows for multi-touch input in combination with an as-rigid-as-possible shape manipulation to support rich visual queries.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
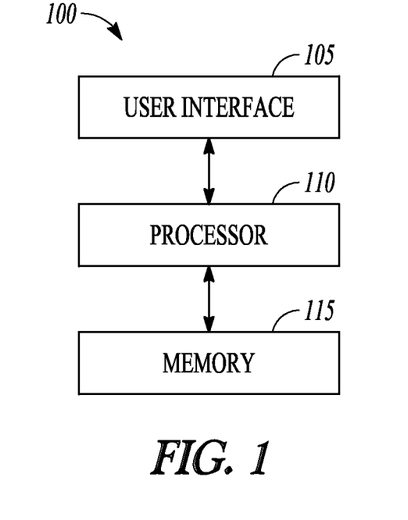
FIG. 1 illustrates a block diagram of one example of the present subject matter.

FIG. 1 illustrates a block diagram of system 100. System 100 includes user interface 105, processor 110, and memory 115, each of which is bidirectionally coupled.

User interface 105 includes an interface that allows a user to interact with system 100. For example, user interface 105 can include a component to allow a user to provide data (such as a mouse, keyboard, wheel, microphone, sensor, or other cursor control device), allow a user to receive data (printer, monitor, speaker, or other transducer), or both provide data and receive data (such as a touch sensitive screen).

Interface 105 can include a mouse-based device or a multi-point input device (such as a multi-touch display).

Processor 110 can include a computer, a supercomputer, a single processor, or any number of individual processors distributed in any number of discrete components or modules. A processor can include an analog processor or a digital processor. Processor 110 is configured to exchange data with user interface 105 and exchange data with memory 115. Processor 110 is configured to execute instructions to implement an algorithm according to the various examples presented elsewhere in this document.

Memory 115 can include a data storage module suitable for storing data for use by processor 110 or for storing data generated by processor 110. Memory 115 can include one or more databases. Memory 115 can store database information such as material properties, standard components, anatomical data, physiological information, image data (such as CT or MRI files), and tissue properties.

System 100 can include other components, including a port for communicating with other devices and systems. For example, system 100 can include an interface for communicating with a device or a network using wireless or wired communication protocols. System 100 can include a connector port to allow coupling with a printer suitable for generating a printed output. System 100 can include a 3D printer coupled to processor 110. System 100 can include a port to enable communicating with a computer aided design (CAD) system.

Figure 2:
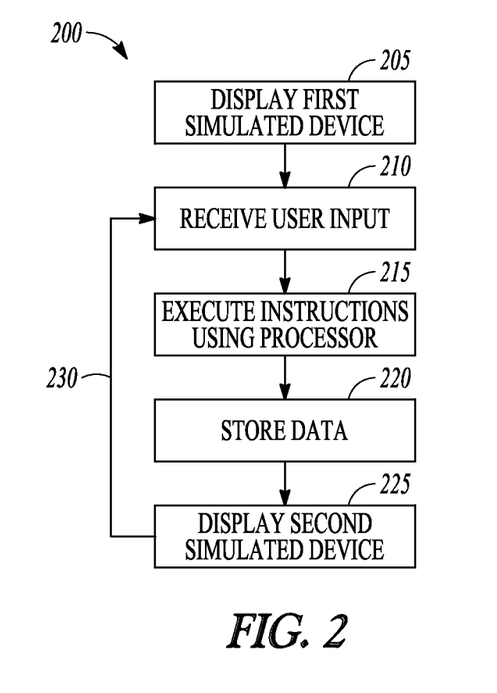
FIG. 2 illustrates a flow chart of an algorithm implemented by one example of the present subject matter.

FIG. 2 illustrates a flow chart of an algorithm implemented by one example of the present subject matter.

Method 200 includes, at 205, displaying a first simulated device. This can include generating a 2D image or 3D image of a device and presenting the image on a screen. The image can be displayed on a touch sensitive screen or displayed by projecting the image in space using, for example, holography.

At 210, method 200 includes receiving a user input. The user input can take the form of a selection in which the user manipulates an icon into a desired position relative to the displayed image and actuates a switch to select a point or region of interest. The displayed image can include a view of the device or data relative to the device. The user input can also be in the form of a dragging operation in which the user moves an icon in space or on a screen relative to the displayed image. The moving icon serves as the user input. The user input can take the form of direct manipulation without need of an icon. In this instance, the user can touch the screen in a manner to select a portion of the displayed image or the device itself and manipulate the image to suit. This can include scaling the image, cutting, extending, rotating, translating, or any of a number of other operations that can be performed in conjunction with a 2D image or 3D image.

At 215, method 200 includes executing instructions using a processor. The instructions can be configured to implement an algorithm to perform a simulation. A simulation can include using engineering tools such as finite element analysis (FEA), computational fluid dynamics (CFD), multi-physics analysis (MPA), polymer analysis, or other forms of modeling or analysis.

A simulation characterizes a relationship between a device design and performance associated with that device design. A parameter characterizing an aspect of a device design, such as a length of a particular component, can affect a parameter of the device performance, such as the force exerted on a tissue surface.

A user input can select a device performance parameter and the present subject matter executes an algorithm to determine the combination of device design parameters suited to produce that device performance. In a similar manner, the user can select a device design parameter and the algorithm implements a simulation to determine the resulting device performance.

The relationship between the device design parameter and the device performance parameter can be modeled or analyzed using a simulation. A simulation can be viewed in a first direction in which an input value describes a device design parameter and the output provides data as to the performance of the device given the particular input value. One example allows direct manipulation of 3D modeling tools. This mode can be described as a forward design.

The simulation can also be viewed in a second direction in which the input value describes a measure of device performance and the simulation provides an output in the form of a device design parameter that provides or delivers the specified performance. This mode can be described as inverse design.

For inverse design, the user can navigate and interpolate within a set of pre-computed simulations, displaying the best match based on the input provided by the user.

At 215, the processor can implement a simulation based on an input that can include a device design parameter and the processor returns a parameter as to device performance. In one example, the processor receives an input that includes a device performance parameter and the processor returns an output in the form of a device design parameter that provides the performance.

In one example, the processor receives initial conditions that include both a device design parameter and a device performance parameter and the simulation generates an output that includes an additional device design parameter and an additional device performance parameter consistent with the initial conditions.

At 220, method 200 includes storing data. The data can be stored in a memory and take the form of a data structure such as a database. The stored data can include a user input and the results of the simulation. The data can also include archival or historical data.

At 225, method 200 includes displaying a second simulated device. This can include displaying a device having a design that is modified by the results of the simulation. This can include displaying a view of a device performance parameter. Displaying a simulated device can include depicting a 2D or 3D model of a device in solid or wire form, or in other views, or it can include depicting a star plot either alone or in conjunction with a physical device. Displaying a device can also include displaying a performance parameter using, for example, graphical information.

Pathway 230 indicates that processing returns to, at 210, receiving a user input. The user can again provide an input that can include a design parameter or a performance parameter, or other input, and the system repeats processing as indicated at 210, 215, 220, and 225.

Figure 3:
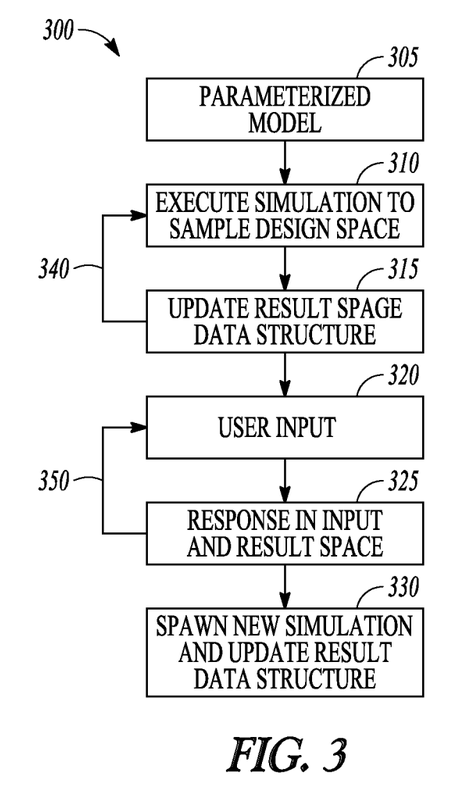
FIG. 3 illustrates a flow chart of an algorithm implemented by one example of the present subject matter.

FIG. 3 illustrates flow chart 300 of an algorithm implemented by one example of the present subject matter. This example can be viewed as design by dragging in which a user can develop a product based on manipulating the design in 2D or 3D space. The algorithm utilizes a similarity metric and morphing function that can be defined for each pair of simulation outputs within the design space.

At 305, a parameterized model serves as an input. The model can be described using any number of parameters. As noted elsewhere in this document, the parameters can characterize the device design or characterize the device performance. Consider one example of a model in which certain geometric aspects are described by parameters.

At 310, a simulation is executed for a particular design space. The simulation is conducted using the parameterization and can include, for example, running a FEA or a multi-physics simulation to evaluate utility of a particular device configuration. A user may be interested in understanding cross-interactions between various parameters and how those parameters affect device performance. The fields of data (whether scalar, vector, or tensor) associated with a design can vary within a volume and over time.

At 315, data corresponding to the results of the simulation is updated. The data can be stored in a star plot as described elsewhere in this document. The simulation conducted at 310 is added to a library of previously stored simulations. Pathway 340 denotes a processing loop by which pluralities of discrete simulations are generated and the results are stored and made available for later access.

The plurality of pre-computed simulations can represent samples selected from the design space.

At 320, the user input is received. The user input, as noted elsewhere in this document, can include data regarding a device design parameter, data regarding a device performance parameter, or both data regarding a design parameter and a performance parameter.

At 325, the system response is determined as to the input space and as to the result space. This can include conducting both forward design analysis in which a device design parameter determines a performance parameter and conducting inverse design analysis in which a design parameter is determined based on a given performance parameter. Pathway 350 denotes a processing loop by which real time calculations are performed and results generated in response to a received user input.

The results can be depicted as a 2D or 3D display of the device, corresponding data, or performance data for the device or any combination of these. In one example, the system is configured to provide a continuous visual morph between the outputs.

At 330, additional simulations and corresponding results (including device design parameters and device performance parameters) are generated. The simulations and results are generated independent of any user interaction or without prompting by a user. In one example, the additional simulations and results are spawned, or generated, at random. In one example, an artificial intelligence algorithm is implemented and the simulations and results are generated based on previous user inputs. The previous user inputs foreshadow specific areas of inquiry for which a user may be interested and the system pro-actively, and independent of the user, generates simulation before specifically requested to do so by the user.

Morphs between simulation outputs can be calculated in a pre-computation step. Since the examples involve warping between multiple 2D scalar fields, a non-rigid image warping can be used.

The data include both structured quasi-rigid deformations and aggressive large deformations. The implementation is related to elastix. A two-step stochastic optimization is used to register the images. In a first step, a non-rigid Euler transformation is applied. Then, a non-rigid B-Spline transformation is applied using a three-tiered image pyramid to capture image features at multiple scales. Mattes Mutual Information (MMI) [Thevenaz and Unser 2000] can be used as the optimization metric. This approach is suitable for images containing large differences in intensity. In one example, the warps are required to be invertible (no foldovers), a property not guaranteed by the B-spline transformation.

To account for this, a regularization factor based on "bending energy" can be added to the metric to penalize sharp deviations in the transformation. The warps between two images, A and B, should be inverses of each other (i.e. A!B is as close to the inverse of B!A as possible) since a cross-dissolve between both warps is displayed during the morph.

In one example, one of the warps can be better than another (based on the MMI metric), so the warps are computed first in both directions, then the best warp is used. The other is then recalculated using information from the first in an optimization that computes a warp close to the inverse.

In one example, the procedure takes 15-30 seconds for a single image warp. This is acceptable in a pre-computation step.

In one example, the warp calculation can be conducted using parallel processing. Warp efficiency can be improved by reducing the number of warps. For example, a sampling strategy can reduce the number of required warps. In one example, the algorithm shifts from using a fully connected graph of simulation results to a random regular graph. The random regular graph ensures that each node is connected via a bounded max path length that scales well even with low degree graphs.

By computing warps along the edges of this graph, it is possible to reach every node, with the caveat that multiple warps may need to be composed to do so. After the warps are pre-computed, the algorithm then computes the all-pairs shortest paths.

The edge weights account for the quality of the morphs, so as to minimize information loss when the warps are composed. In one example, $e_i$=MMI(e)+c, where MMI(e) is the MMI metric for the edge and c is a constant that is larger than sum of the MMI metrics for the longest path in the graph. This ensures that paths of minimum length are selected, and in the case of a tie, the path with minimum MMI is chosen. For time varying simulations, additional edges can be added to the graph to connect results from consecutive time steps to ensure that a continuous navigation through the time steps is always possible.

Figure 4:
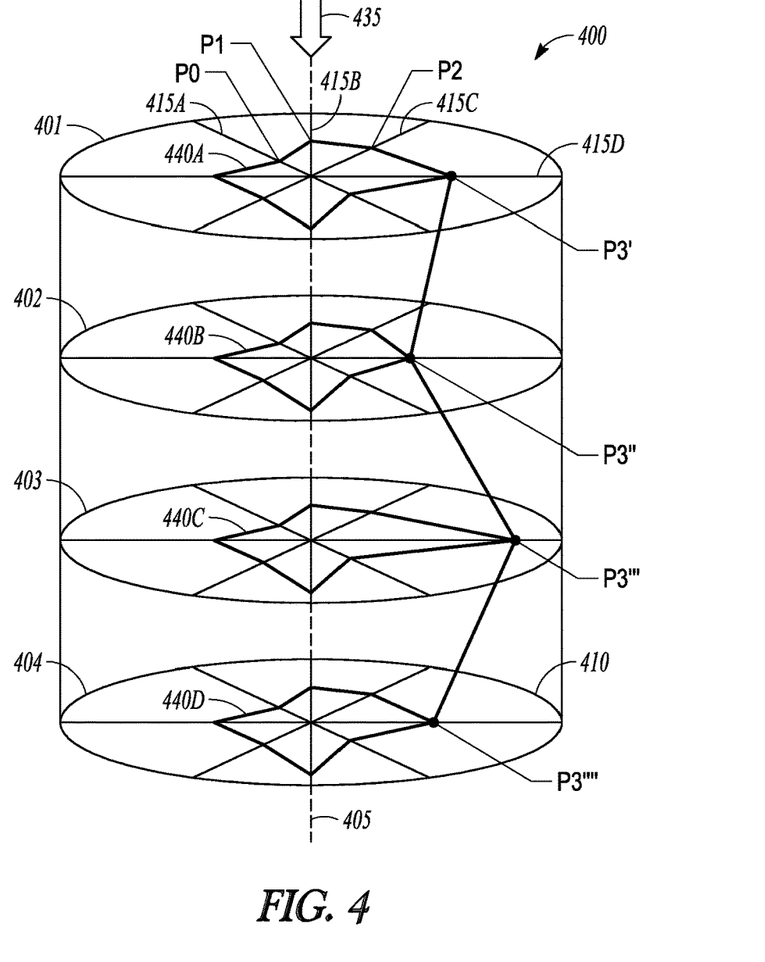
FIG. 4 illustrates a view of stored data corresponding to one example of the present subject matter.

FIG. 4 illustrates a view of stored data corresponding to one example of the present subject matter. The stored data is depicted using star plot 400.

In the example shown, star plot 400 includes layer 401, layer 402, layer 403 and layer 404. Layers 401-404 are aligned on common axis 405 and each layer depicts a discrete configuration for a device. A layer, such as layer 401, includes a plurality of spokes with each spoke corresponding to a parameter. The parameter associated with a spoke can be a device design parameter or a device performance parameter.

Arrow 435 indicates a direction in which the rigor of analysis is increasing with passage of time. Accordingly, arrow 435 can be viewed as a dimension of time or as a dimension of rigor in the analysis.

As shown in the figure, layer 401 includes spokes extending between a hub (at axis 405) and a periphery (as shown at 410 in layer 404). The parameter associated with a spoke can have a particular value that falls between a first value (located at the hub) and a second value (located at the periphery). In one example, the particular value of a parameter signified by a position at the hub can be a minimum and the value at the periphery can be a maximum. In one example, the spoke length denotes the permissible range of values for a parameter.

Star plot 400, in the example shown, includes layers having eight parameters. Examples of parameters can include a displacement value, a material density, a radius, a length, a position, an offset value, a force magnitude, stress, flow volume, energy consumption, field magnitude, field direction, drug dispersion, a force direction, a device speed profile, a modulus of elasticity of a material, a weight of a component, and a load profile. A parameter can characterize an intrinsic parameter of the device (such as device geometry or device materials), performance of a device, or an extrinsic parameter corresponding to the device. One example of an extrinsic parameter can include an electric current limit for safe operation of the device. An extrinsic parameter can relate to an environment in which the device is to be deployed. Examples of environmental parameters can relate to anatomy or blood flow.

In layer 401, parameter 415A has particular value P0, parameter 415B has particular value P1, parameter 415C has particular value P2, and parameter 415D has particular value P3'. The particular parameters P0, P1, P2, P3' and other parameters illustrated define a polygonal geometric shape 440A in layer 401. In similar manner, the various parameters of layer 402 define shape 440B, and the various parameters of layer 403 define shape 440C, and the various parameters of layer 404 define shape 440D.

In layer 401, layer 402, layer 403, and layer 404, parameter 415D has particular value P3', particular value P3", particular value P3''', and particular value P3"", respectively. A line connecting the particular values P3', P3", P3''', and P3"" reveals the changes from layer to layer and thus, illustrates the various configurations of a specific device.

In one example, the device can be characterized using parameters 415A, 415B, 415C, and 415D. A more detailed characterization can include a larger number of parameters.

Arrow 435 can represent time-wise evolution of a design. Over a period of time, this can range from the time of an initial concept, to prototype, to commercial embodiment. The time-wise view of the data can provide a record for the evolution.

Parameter values can be independent or dependent. An example of an independent parameter can include a length of a component. An example of a dependent parameter can be the diameter of a lumen; the lumen diameter can be limited by an outer diameter dimension.

A user can select a particular value for a parameter by selecting and dragging along a spoke of a star plot or by other control means. The value of a parameter may be continuously variable. The value of a parameter may be variable in discrete increments or allowed to snap from one value to the next in discrete units.

In one example, a parameter depicted on star plot 400 represents a performance parameter. The performance parameter is determined as a function of one or more other device design parameters. The range of permissible values for the performance parameter can delineate a safe or acceptable operating range. If a particular combination of device parameters returns a result in which the performance parameter falls outside the permissible range, then the polygon shape fails. In one example, a result yielding an impermissible value for a performance parameter is flagged as a violation and an alert or other notification is provided to the user. Feedback can be provided to a user for a parameter value, or a combination of parameter values, that is to be avoided or to be pursued.

In one example, a spoke of star plot 400 is color coded along its length to denote a preferred range or "sweet spot" of values within the acceptable range. The star plot can be tailored to change colors during morphs to provide an indication of the uncertainty for the current design displayed.

The number of parameters in star plot 400 can be selected according to the complexity of the device and the number of independent variables to be calculated by the system. The number of dependent performance parameters may be related to the complexity of the device and other external factors such as the environmental factors such as regulatory constraints and market forces.

A particular parameter value can be fixed for all simulations or for a predetermined set of simulations. A parameter can be independent and allowed to freely float. A parameter can have a value that is weighted according to a predetermined function or dependent on other parameters or depend on a user input.

In one example, a tab at the end of a spoke (or other feature) allows a user to adjust the weighting of the parameter. The weighting is applied in Equation 1 (described elsewhere in this document). A tab can have one of three states: pinned (the weight is infinite, so the parameter will not vary during any interaction), normal weighting (the parameter is weighted equally to all others), and free (the parameter has zero weight; it might vary dramatically even in results that are considered close to each other). Either one or both of a device design parameter and a device performance parameter (e.g., total power consumed) can be weighted to limit exploration to a subset of the design space.

In one example, weighting can be used to limit the design space for constrained exploration. For example, by pinning the parameters for the load applied to a biopsy device, the user can evaluate the subset of design possibilities that have been simulated for a specific loading condition.

In one example, multiple star plots can be displayed on the user interface. One displayed star plot can be configured to show input parameters (device design parameters) and one star plot can be configured to show output parameters (device performance parameters). In one example, both device design parameters and device performance parameters are depicted on a single star plot.

Arrow 435 can be construed as indicating a direction of increasing rigor. At the outset of an analysis, a plurality of predetermined simulations are stored in memory 115. It is this initial library of solutions that provides the first results. Commensurate with user input, new simulations are performed and the results of these simulations are added to the stored data. During those times for which the processor 110 is idle, one example of the present subject matter is configured so that the processor generates and spawns new simulations. These new simulations, whether randomly generated or generated based on artificial intelligence or other factors, provides an increasingly rich library of simulations which can improve the accuracy of the analysis. This increasing accuracy is indicated by the increased rigor of the analysis, as shown by arrow 435.

Artificial intelligence can be utilized to intelligent spawn new simulations based on identified areas of interest of the user. Processor 110 can be configured to implement an artificial intelligence algorithm to recognize a pattern of user investigation. Based on the recognized pattern, the present subject matter can be configured to allocate processing resources to pre-compute and store simulations. In this manner, an area of inquiry, such as motor loading, will have a rich library of pre-computed simulations readily available for later investigation.

The varying levels of rigor are configured to tailor the analysis according to available resources and time. Rather than immediately engaging in complex simulations (possibly taking hours or days of computer time) early on in the design process, the present subject matter begins analysis at a higher level. The analysis levels (which can be represented by levels 401, 402, 403, and 404) denote variable levels of complexity or granularity ranging from simple (e.g. beam equations for stress and bending analysis) to very complex (e.g. FEA with very fine meshing).

A history of design choices for each parameter can be recorded and displayed in a variety of ways. The stored data can also serve as a historical record of decisions corresponding to various considered design configurations. In one example, the alternative designs are indexed by the analysis level as shown in FIG. 4.

A historical record of design choices can facilitate development of a new device design. For example, if the acceptable range of a performance parameter is changed during the design process, then subsequent analysis and development can commence from an earlier recorded device configuration without beginning the development process completely anew.

The device design process can be enhanced by human interaction. For example, a user's observation about sensitivity of specific parameter can affect later designs. A graphical depiction, such as that of star plot 400 can reveal parameter sensitivities and lead to improved design process efficiency.

In one example, a user can manipulate a device design parameter or a performance parameter of a candidate device by using the interface to control a star plot. For example, a user can select a particular spoke and change the particular value by dragging a cursor or by directly manipulating the particular value. The present subject matter executes a simulation based on a forward design solution or an inverse design solution according to the type of parameter manipulated by the user. As noted elsewhere in this document, the selected parameter may be configured to snap between discrete values or the parameter may have a limited range of permissible values.

In one example, the user can rapidly resume analysis and modeling by selecting a particular layer of a star plot. When a previous layer is selected, the device configuration reverts to the configuration matching the stored values at that particular layer. In this way, the star plot serves as a navigation tool to rapidly explore new areas of investigation.

Figure 5:
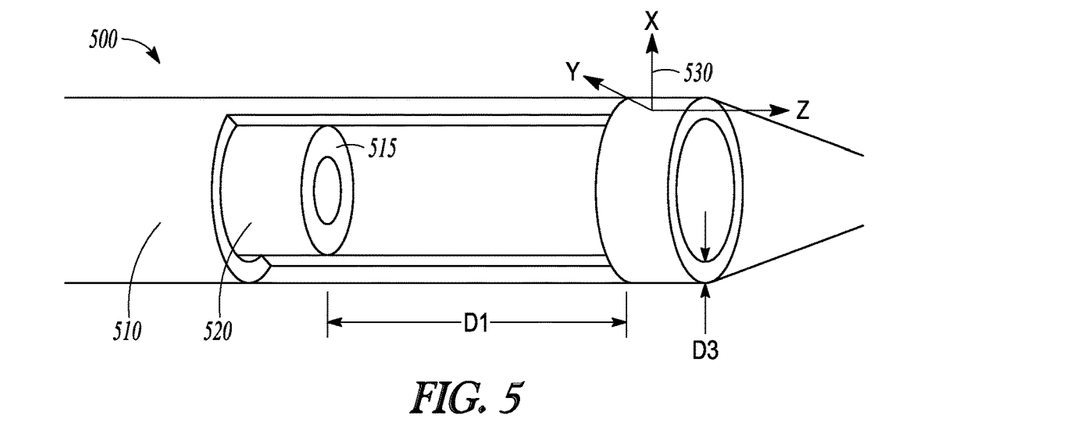
FIG. 5 illustrates a view of a model of a device that can be designed using an example of the present subject matter.

FIG. 5 illustrates a view of a parameterized model of device 500 that can be analyzed or designed using an example of the present subject matter.

Device 500 can represent a tool for performing biopsy surgeries. Device 500 has a sharp point and a tissue collection window. Device 500 includes two concentric cylinders with one cylinder having a cutting cannula that has a sharpened edge configured to slice though tissue after a vacuum draws the tissue through the collection window. Device 500 includes any number of device design parameters and in this example, some are marked as follows. Body diameter 510 represents a device design parameter having a size limited by practical constraints. Wall thickness D3 is another device design parameter. The combination of diameter 510 and wall thickness D3 limits the inner sleeve diameter 520. Face 515 of the inner sleeve travels along distance D1.

Device 500 represents a graphical representation that can be depicted on the user interface. A user can provide an input to the system in order to manipulate and analyze various device configurations. In one example, a user can manipulate a cursor to position and select a diameter, such as diameter 510, and drag the image to change the dimension.

To explore the device design, the user interface is manipulated to grab onto the geometry of the device and reshape the device to suit. If the interaction implies a drastic change to the underlying model, then the interaction space is treated as a proxy model that settles back to the underlying model once the interaction is complete. The system displays a morph between the starting configuration and the closest result in the direction indicated by the user. The system updates immediately and continuously in response to the user input.

In a forward design, the user can select distances and values for device design parameters and the system executes an algorithm to determine a corresponding simulation. The simulation determines the device performance parameters. The user input can be selected using a dragging operation, a direct manipulation, or by manipulating a cursor.

A user can select (for example, click and drag in an appropriate location on the parameterized model) to specify alternative values for device design parameters. The system is able to interpret the intent of users' drag operations based on a mapping from features of the parameterized model to device design parameters associated with the simulation. Features can be defined differently depending upon the application. A feature can be a face, an edge, a cutout, or other geometric property of a model. For an input parameter that does not have a natural direct mapping to the model geometry, a proxy geometry (such as an arrow or other icon) can be used to indicate the location and direction of a load applied to the geometry during simulation.

Device design features can be mapped to simulation input parameters. In one example, the mapping relationship is defined manually in which each feature is associated with one or more simulation input parameters that can be manipulated interactively.

A particular graphic representation can have several logical features that a user can select. Since several parameters might be associated with a single feature, the direction of travel of the user input can be used to select the specific parameter to modify. In one example, a user can select one of a plurality of parameters associated with a particular device feature based on the direction of a dragging operation. For example, tool 530 appears when a user selects the outer cannula of device 500 and the direction of motion selected by the user determines the specific parameter to be modified. In the example shown, a drag in the direction indicated by axis Y is associated with a change in the outer cannula radius, a change in the direction indicated by axis Z is associated with a change in length of a feature (such as D1) of the cannula, and a drag in the direction indicated by the X axis is associated with a change in a material property for the outer cannula.

To discern the user's intent, the system first identifies the feature upon which the user has clicked using raycasting. Then, after the user's cursor movement exceeds a predefined threshold (e.g., 10 pixels) away from a point of initial click, the parameter to manipulate is set by finding the closest match between the user's motion vector and the ideal motion vectors associated with each parameter.

After having identified the input parameter, the displayed device is updated continuously in response to a user dragging motion. The system first identifies the closest pre-computed simulation result in the direction implied by the user's dragging movement, and then the display is redrawn to show a linear interpolation between this result and the most recent valid configuration. The interpolated result involves not just interpolation of the parameter that is being actively modified but also all other parameters (both simulation inputs and outputs).

A metric can be used to identify the closest match in the design space during the interaction.

Beginning with the design space of all pre-computed configurations $C:=\{C_1, C_2, \ldots, C_N\}$, where each configuration $C_i$ is a vector with one element for each input parameter and optionally also for each scalar output the designer wishes to define.

Thus, $C_{i,1}$ contains the normalized value of the first input parameter for i-th configuration, $C_{i,2}$ contains the normalized value of the second input parameter, and so on.

Processing entails searching for the target configuration with the minimum distance from the starting configuration, where distance is calculated based on a weighted combination of the change that occurs across each parameter in the model:

$$D(C_i, C_j) = \sum_{k=1}^{nparams} \sqrt{w_k * (C_{j,k} - C_{i,k})^2} \qquad (1)$$

Weighting can be applied in Equation 1 to guide the interface.

One example employs a proxy model for direct manipulations in situations where the user input specifies a drastic change to the design, for example, scaling the model to the extent that it would no longer lie under the user's cursor.

The proxy model is integrated into a callout window that displays a zoomed-in view of results. This approach can be adapted to include a notion of "settling". When the user completes an interaction, the proxy model gradually morphs into the current working model to rectify any changes.

For inverse design, the user specifies a desired output (performance) and the system determines the device design configuration that best generates this output. The user interface allows direct manipulation of a visualization of simulation results in order to create a continuous visual query for use in inverse design.

Preview bubbles provide the user with design hints. Each bubble can be viewed as a lens to show what the simulation output would look like if the user dragged the curser to the center of the bubble. The bubbles are created in screen space so a more detailed local visualization of design alternatives can be viewed by zooming in.

In an inverse design, a user provided drag operation affects the simulated performance parameters (for example, bend and reshape stress fields) and the system responds continuously by displaying morphs between the precomputed simulation results.

Using a design by dragging approach, a user can tug directly on the visualization of simulation results to navigate within the design space. This approach entails knowing the transition from each simulation output to the others. In one example, outputs are 2D scalar fields (in the case of the biopsy device the 2D field is wrapped around the cannula of the device).

Therefore, a 2D image warp (a morph) is used to transition from one simulation output to another.

Assume that such a warping function exists between every pair of simulation outputs within the design space. The user intent can then be discerned by first projecting the motion of the dragging operation into the 2D result space, then finding the closest match between this motion and the motion that the data point under the cursor would take as defined by the warp. If multiple cursors are used (as in a multi-touch interface), then the same strategy applies and the dragging motion of each cursor is compared to the warp defined at each cursor location.

Thus, for inverse design manipulations, the following distance metric can be used to find the closest result space match to the user's intent based on the motion of n cursors.

$$d(C_i, C_j) = 1.0 - \frac{1}{n}\sum_{x=1}^{n} |||p'_x - p_x|| \cdot ||w(C_i, C_j, p_x) - p_x||| \quad (2)$$

Here, $p_x$ is the starting position of x-th cursor, $p'_x$ is its current position during dragging, and $w(C_i, C_j, p)$ is a function that translates a 2D point p according the warp defined between $C_i$ and $C_j$. Since the result of this calculation is a value between 0 and 1, it can be used almost directly in Equation 1; it simply replaces the squared term in the equation so that it acts as a distance value for a parameter (a parameter based on user input).

In one example, the interface can be tuned to include hysteresis; once a target configuration has been identified using the strategy above, the user can make a move toward another configuration in order to snap the interface away from the current target and orient toward a new target.

The parameters identified in FIG. 5 can be plotted using a star plot such as that in FIG. 4. In addition, the system of FIG. 1 can be used to generate simulations that characterize the performance of device 500.

In one example, a user can select two locations, regions, or features depicted on a screen. The user can click and drag one location relative to another location and thus change the spacing or length. Commensurate with the changes in the dimension, the user can see the changes in performance. The changes can be shown in a star-plot (showing device design parameters or device performance parameters) appearing on the user interface.

In addition to facilitating visualizing, storing, and manipulating device design parameters, star plot 400 can also be used to visualize, store, and manipulate device performance parameters.

A graphical representation of a device can also be used to manipulate a performance parameter. FIGS. 6A, 6B, 6C, and 6D illustrate views of device 600, corresponding performance parameters, and single point manipulations. A single point manipulation can be used for local adjustments to the simulation outputs.

A graphical representation of a local operation can include an additional view on the user interface. For example, a display screen can depict both the device under consideration and one or more view, sometimes called preview bubbles. A preview bubble can be displayed as an overlay atop the device or in a nearby portion of the display. A preview bubble can provide an advance view of expected results if a particular corresponding change is made in the device.

A preview bubble can be configured to dissolve, fade, or disappear from view after the user has taken an action to adopt a change associated with the device that is consistent with the view foreshadowed by the preview bubble. For example, a device can be displayed on a screen along with one or more preview bubbles. The user can select one of the preview bubbles, the device configuration will change to reflect adoption of the change, and the initial set of preview bubbles view will disappear. A replacement set of preview bubbles will then be generated to show new opportunities for design exploration.

A preview bubble can be configured to dissolve, fade, or disappear based on an affirmative instruction from the user.

A preview bubble can provide a preview of device performance. The user can select a location and drag an icon or manipulate the image in a particular direction to see changes in the device parameters.

Figure 6A:
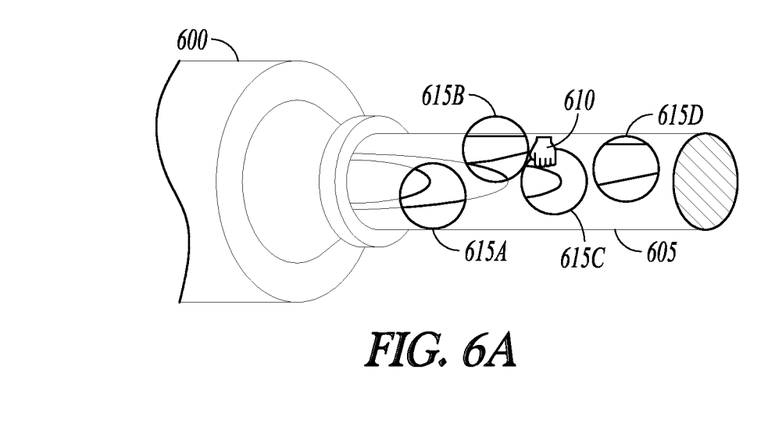
FIGS. 6A, 6B, 6C, and 6D illustrate views of a device that can be designed using an example of the present subject matter.
Figure 6B:
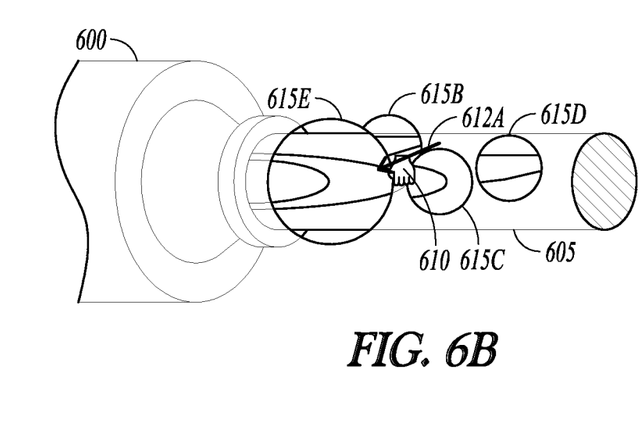
Figure 6C:
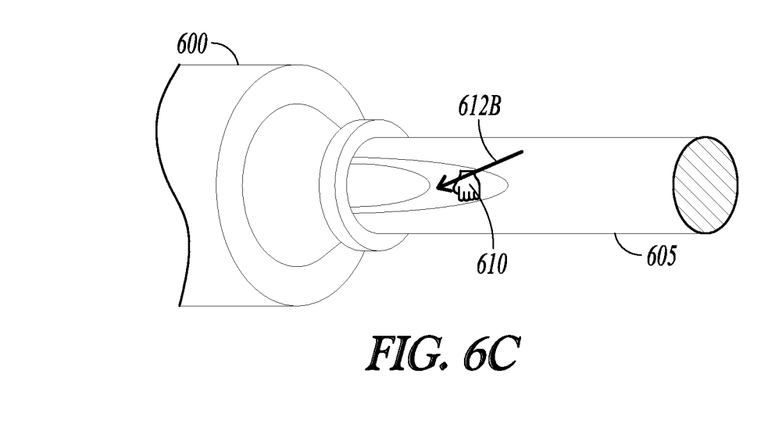

FIGS. 6A-6C illustrate device 600 having a collar and tubular shaft 605. The surface of shaft 605 is depicted with iso-contour regions that can be viewed as representative of a performance parameter such as temperature or mechanical loading.

In FIG. 6A, the user has manipulated cursor controlled icon 610 to a position relative to shaft 605 and selected a point of interest. The system recognizes placement of icon 610 and the user selection of the point as in indication of interest in exploring design options and generates a plurality of preview bubbles. In this figure, the shaft is overlaid with preview bubbles 615A, 615B, 615C, and 615D. In this example, the preview bubbles are non-overlapping circular windows sized to fit on the screen and located in a position on the shaft to indicate a direction of control required from the user in order to invoke the particular view. In particular, preview bubbles 615A, 615B, 615C, and 615D each are filled with contour regions comparable with the view that adorns other portions of shaft 605.

In FIG. 6B, icon 610 has been shifted in a direction towards a preview bubble 615E. Preview bubble 615E is a larger diameter version of preview bubble 615A. In one example, preview bubble 615E represents a refined or more accurate simulation of that which was shown in preview bubble 615A. The diameter of preview bubble 615E is increased relative to predecessor preview bubble 615A. Preview bubbles 615B, 615C, and 615D remain unchanged. At the time depicted in FIG. 6B, the user has dragged the icon from the position shown in FIG. 6A by a distance noted by pathway 612A.

At FIG. 6C, the user has made an affirmative selection of the graphical representation depicted by preview bubble 615E. An affirmative selection can be indicated by user actuation of a mouse button or other switch. Pathway 612B indicates the movement of icon 610. Upon selection by the user, the previous set of preview bubbles disappears.

Figure 6D:
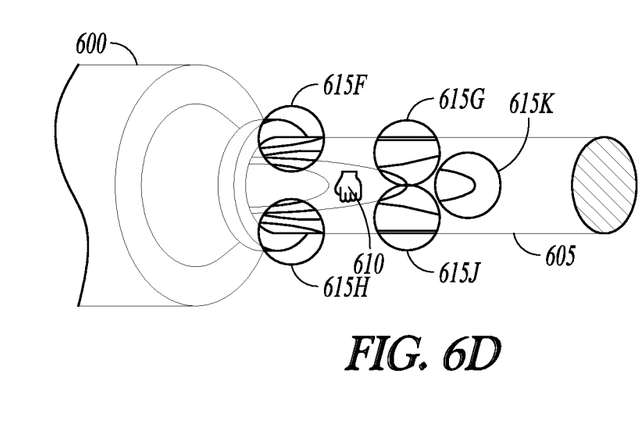

At FIG. 6D, the user has selected a replacement point of interest (by clicking a mouse button, for example) and the system has calculated and displayed another set of preview bubbles, here depicted as preview bubbles 615F, 615G, 615H, 615J, 615K with positions and content corresponding to the location of icon 610 relative to shaft 605.

The user can select a point of interest by clicking and the system responds by providing an in-place visualization of how the output scalar field would change if the user dragged in the direction of the bubble and released the cursor near the center of the preview bubble. The algorithm is configured to identify the motion vector for the output sample under the cursor for each of the morphs in the result space and uses this vector to compute a new ideal ending position for the user's drag operation if the user manipulates the icon in the manner indicated by a bubble.

The system then displays as many preview bubbles as will fit without overlap at these ending positions. To bias the results toward the most logical transitions, bubbles are placed into view based on a list of all the possible morphs ranked by the sum of squared differences between values in the current output field and the target field for each morph.

The images depicted in FIG. 6A-6D represent an example of the interface, including the visual feedback during the drag operation. When the drag operation moves within a threshold of the center of a bubble, the display snaps to this valid configuration, and the interface is restarted with a new set of preview bubbles. Since the bubbles are defined in screen space, the user can adjust the number of preview bubbles to display by zooming in or zooming out.

The user interface can be manipulated to change the level of zoom (make the displayed image appear larger or smaller). By changing the zoom, the user can control the size and number of preview bubbles presented for a particular device configuration. For example, by zooming in for a closer view of the device, the window of enlargement appears, and more preview bubbles appear.

An example of the present subject matter can be applied to designing a vacuum assisted biopsy device such as that shown in FIG. 5. The simulations describe scenarios where a load is applied perpendicular to the main axis of the device. For example, during a breast biopsy operation, a physician may apply such a load by pushing the device against the ribcage in order to insert the device into difficult-to-reach regions. If the load is too great, the cutting action or another aspect of the design may fail. On the other hand, if the cannulas and/or motors are strengthened, the device may become too obtrusive, leading to a more invasive procedure, a device that is difficult for the physician to balance in his hand, or other problems.

In addition to geometric input parameters (device design parameters), a user can set input parameters that are defined as a function. The motor load profile and tissue properties are two such examples. Each of these parameters is associated with a proxy icon in the model (the motor casing or a sphere shape drawn within the cutting window for tissue). When the user input cursor is hovered over these proxy icons, an interactive plot is displayed.

One example includes wrapping the FEA output field around the geometry of the device. During the warp calculations, these images are tiled on both sides of the dimension that is wrapped around the cylinder. During a drag operation, dragging operations that cross the texture boundary are identified and handled as a special case.

In some cases, such as global adjustments to a simulation, a multi-touch manipulation is suitable. A multi-touch manipulation can include contacting a touch sensitive interface using more than one finger of a user. The multiple contact points are interpreted as a multi-touch manipulation.

Multi-touch manipulation allows manipulation of multiple cursors and can provide a rich input stream that enables complex manipulations of a device configuration and corresponding simulation. Multi-touch manipulation can rapidly and dramatically change the simulation. The visual deformation of the device configuration (device design parameters and device performance parameters) provides the feedback to the user. In one example, preview bubbles are not used.

Figure 7A:
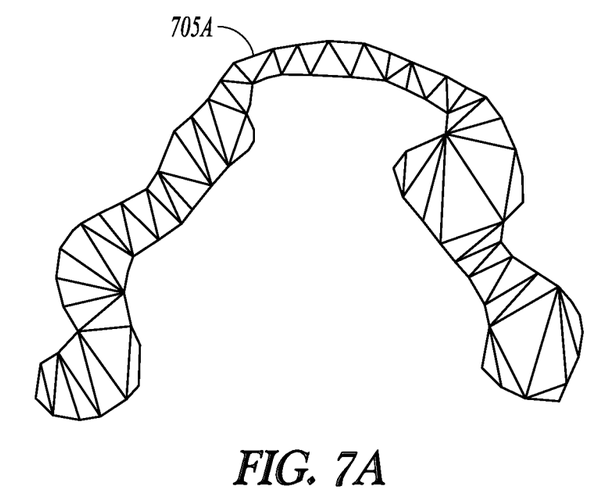
FIGS. 7A and 7B illustrate views of an effect manipulated according to one example of the present subject matter.
Figure 7B:
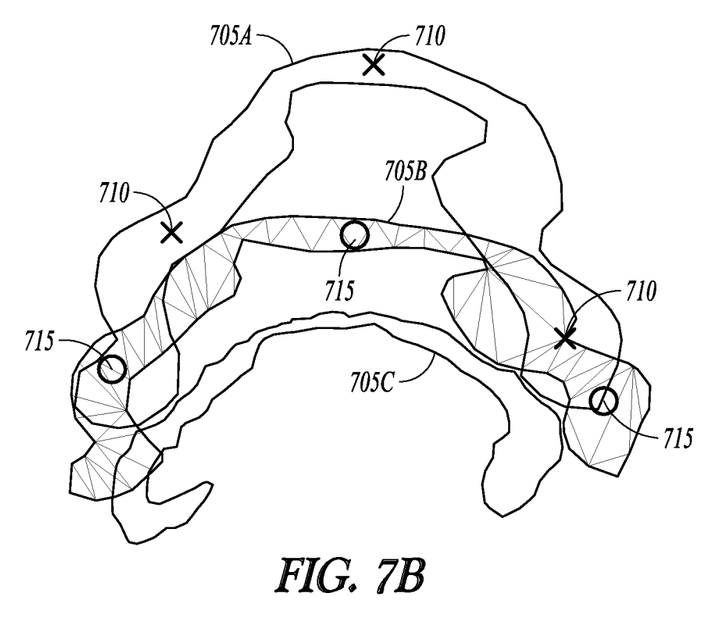

FIGS. 7A and 7B illustrate views of a visual effect (here, a flame) displayed on a user interface according to one example of the present subject matter and controlled using multi-touch manipulation. In FIG. 7A, the displayed image represents a flame pattern that can be designed to suit a particular application. In an abstract sense, FIG. 7A can also be viewed as a device or a portion of a living body. The initial contact between the user and the touch sensitive display commences an algorithm to facilitate scalar field visualization. The value under this cursor (the initial point of contact) is used to extract an isocontour from the scalar field. The interior region of the largest connected component of this contour is then triangulated to create a control mesh, as shown in FIG. 7A. This mesh is manipulated via natural multi-touch interactions using an as-rigid-as-possible shape manipulation algorithm, which uses a real time optimization to intuitively preserve the shape of the mesh given the deformation constraints implied by each of the control points at the user's fingers. While manipulating the image on the user interface, the system continuously updates and displays an interpolated result as indicated the movement of the user on the touch sensitive display. Equations 1 and 2 can be used to determine the best match in the simulation result space. Each vertex of the control mesh, as shown by the triangles in shape 705A acts as a separate cursor in the equation, thus enabling the user to specify changes in the output across large areas in a single manipulation.

FIG. 7B illustrates shapes 705A, 705B, and 705C. In FIG. 7B, the triangular mesh is omitted from the illustration of shape 705A. Finger-based cursors are noted at 710 (in shape 705A) and 715 (in shape 705B). Shape 705C illustrates another configuration.

Figure 8A:
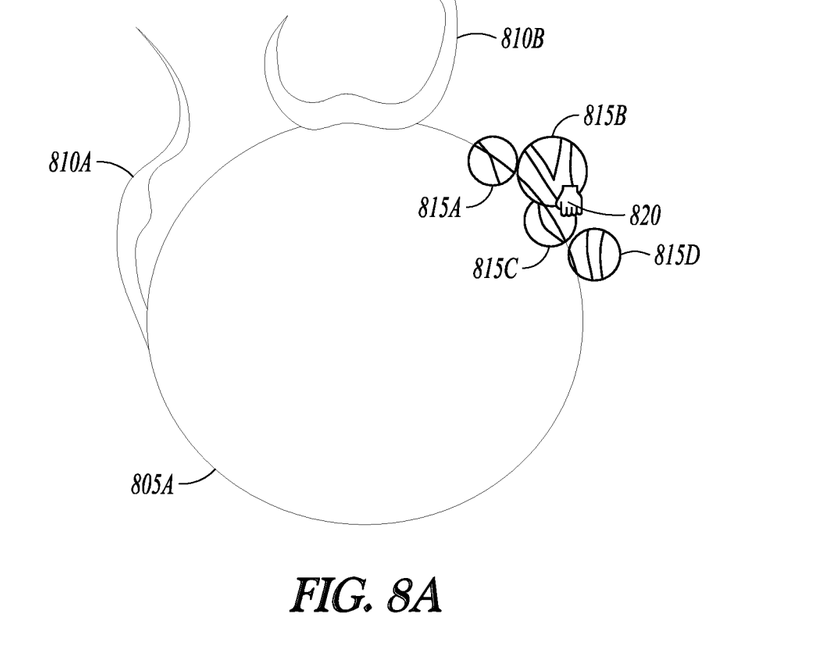
FIGS. 8A and 8B illustrate views of an effect manipulated according to one example of the present subject matter.
Figure 8B:
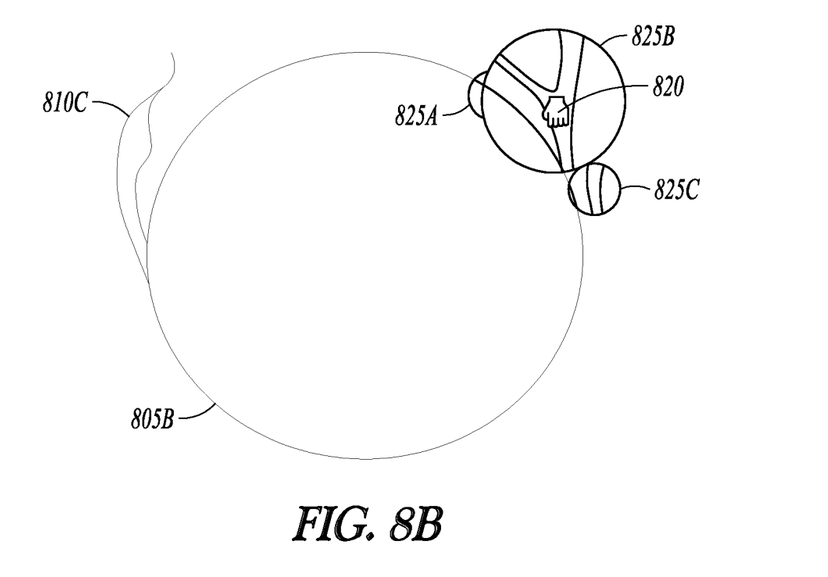

FIGS. 8A and 8B illustrate a flame effect represented in conjunction with a set of preview bubbles. The visual effect of a flame can be treated using the present subject matter in order to design a suitable pattern. A visual effect, such as that associated with a flame, involves time varying data with a freeform configuration. Two fire simulations can be generated with predetermined input parameters including velocity, noise, viscosity, temperature emission, fluid emission, and density emission. The dataset can represent a point-based flame emitter or a ring of fire (as in FIGS. 8A and 8B). Datasets can represent 50,000-60,000 warps.

An inverse design solution approach can be used to explore the datasets. A user can search for a particular flame configuration (a specific height or with wisps of a particular shape fanning out of the ring). The multi-touch inverse design strategy is suitable this application. The multi-touch cursor approach can be used for as-rigid-as-possible shape manipulation to the entire scalar field by using a regular grid over the entire image as a control mesh. Another approach entails first extracting an iso-curve in the region of interest indicated by the user and then using the shape defined by this curve as the control mesh.

FIG. 8A illustrates ring 805A having flame elements 810A and 810B. Preview bubbles 815A, 815B, 815C, and 815D are distributed about a portion of a flame element. Preview bubbles 815A, 815B, 815C, and 815D appear in the image based on placement of icon 820 in the region of the flame element.

FIG. 8B illustrates ring 805B having flame having element 810C. Preview bubbles 825A, 825B, and 825C are distributed about a portion of a flame element. Preview bubble 825B (having icon 820 centered thereon) has a greater diameter than corresponding preview bubble 815B.

FIGS. 8A and 8B illustrate manipulation of flame shape. Clicking and dragging at selected locations atop the new flame allows the user to further refine the flame shape.

NOTES & EXAMPLES

An example of the present subject matter is configured to provide near real time coupling between a user controlled input and a displayed image generated based on a plurality of pre-computed simulations. The user can randomly manipulate a device parameter or a performance parameter and immediately see the outcomes in the graphical display.

The library of pre-computed simulations allows rapid morphing between pairs of simulations. For example, the user input may call for traversal across a particular space in the design and the present system provides a continuous graphical depiction between simulations corresponding to the selected endpoints.

In other words, a currently displayed device configuration can have a first parameter (either device design or device performance) with a first particular value and the user input can call for the first parameter to transition to a second particular value. The system selects a 'second' simulation (from those already computed and stored in memory) corresponding to the second particular value. Commensurate with the user transition to the second particular value of the parameter (that is, while dragging the parameter value), the system generates and displays (in near real time) a continuously varying image corresponding to a mixture of the initial simulation and the second simulation.

At a time when the user input has travelled to a distance ⅓ of the way between the first particular parameter value and the second particular parameter value, the displayed image corresponds to a mixture that can be viewed as ⅔ based on the initial simulation and ⅓ based on the second simulation. At a time when the user input has travelled to a distance ⅔ of the way between the first particular parameter value and the second particular parameter value, the displayed image corresponds to a mixture that can be viewed as ⅓ based on the initial simulation and ⅔ based on the second simulation. At a time when the user input has reached the second particular parameter value, the displayed image corresponds wholly to the second simulation.

In the context of the present subject matter, the notion of real time is limited by the refresh rate of the display or by other practical limits. That is, if the frame rate is display is updated at a rate of 30 frames per second, then the movement of the cursor is read and the depictions rendered at this rate of change.

The various examples presented here describe an approach to simulation-based device design for tuning parameters of computationally-intensive simulations and visually evaluating large sets of results. One example provides a strategy and data structure to establish correspondences between arbitrary scalar fields output from FEA and CFD simulations and morph between these fields. One example includes algorithms for interpreting the underlying intent of a drag operation relative to parameterized models and simulation outputs. In addition, the present subject matter allows in-place interactive data visualization for large sets of related simulation results. A dragging feature uses multi-touch input in combination with an as-rigid-as-possible shape manipulation to support visual queries.

In one example, a real time connection is provided between the present subject matter and a commercially available computer aided designing (CAD) software package. This connection enables coordination between a CAD model and the current state of the design.

In one example, a CAD model serves as a starting point for automatically identifying the key geometric parameters that can be adjusted within the model using the parameterization described herein.

In one example, a random sampling is used to populate the design space with pre-computed results. Other strategies can also be used.

A user controllable selection tool can include a cursor, a pointer, an icon (such as a hand-shaped image) or other type of feature. In one example, a user makes a selection based on direct manipulation of the graphical representation of the device or by manipulating a performance parameter.

One example of the present subject matter provides near real time immediate visual feedback to the user. While the user is performing a dragging operation, the present subject matter provides feedback in the form of a morph between a first simulation and a second simulation. The user can drag in a first direction and then, without hesitation, change direction or reverse the dragging operation. The system responds in near real time to show the morph that will result if the dragging operation settles at a particular position.

In this way, the user can reversibly try-out different solutions and select the most promising solution. As such, a large number of simulations can be quickly evaluated by the user.

A user can select or control a geometric value using one example of the present subject matter. For example, a user can specify a device having a triangular configuration (three sided) in a first instance and later select a parameter that transitions the device to a four-sided or five-sided device. In another example, a round component can be reconfigured using the present subject matter as a square component.

Displaying a simulated device can include presenting an image of a physical device on a user interface. In addition, the device can be displayed by way of a schematic, a mesh, or a graphical depiction of performance (such as an x-y graph, a plot, or a star plot).

Example 1 can include or use subject matter such as a system including a user interface, a processor, and a memory. The user interface is configured to depict a first graphical representation of a device having a first configuration corresponding to a first simulation. The user interface is configured to receive a user input corresponding to the device. The processor is coupled to the user interface. The processor is configured to select a second simulation from a plurality of discrete simulations. The second simulation corresponds to the user input. The memory is coupled to the processor. The memory is configured to store the plurality of discrete simulations. Each simulation includes device design parameters and corresponding performance parameters. The plurality of discrete simulations includes the first simulation and includes the second simulation. The processor is configured to generate a second graphical representation of the device having a second configuration. The processor is configured to depict the second graphical representation using the user interface. The second configuration is determined using the second simulation.

Example 2 can include, or optionally be combined with the subject matter of Example 1, to optionally include wherein the processor is configured to execute instructions to depict at least two graphical representations of the device in response to receiving the user input associated with a user controllable selection tool and wherein the processor is configured to execute instructions to calculate an interpolated simulation between the at least two graphical representations at a rate determined by the user controllable selection tool and in a direction determined by the user controllable selection tool.

Example 3 can include, or optionally be combined with the subject matter of any one of Example 1 or 2 to optionally include wherein the processor is configured to execute instructions to depict a plurality of graphical representations, each graphical representation corresponding to a simulation.

Example 4 can include, or optionally be combined with the subject matter of any one of Example 1-3 to optionally include wherein the user input is associated with a device design parameter.

Example 5 can include, or optionally be combined with the subject matter of any one of Example 1-4 to optionally include wherein the user input is associated with a performance parameter.

Example 6 can include, or optionally be combined with the subject matter of any one of Example 1-5 to optionally include wherein the processor is configured to execute instructions to identify a simulation based on an earlier user input.

Example 7 can include, or optionally be combined with the subject matter of any one of Example 1-6 to optionally include wherein the processor is configured to execute instructions to implement a shape deformation algorithm.

Example 8 can include, or optionally be combined with the subject matter of any one of Example 1-7 to optionally include wherein the processor is configured to store a time-wise record of device configurations.

Example 9 can include, or optionally be combined with the subject matter of any one of Example 1-8 to optionally include wherein the user interface includes a three-dimensional modeling display.

Example 10 can include, or optionally be combined with the subject matter of Example 2 to optionally include wherein the processor is configured to execute instructions to depict at least two graphical representations of the device in response to receiving the user input associated with the user controllable selection tool.

Example 11 can include, or optionally be combined with the subject matter of any one of Example 2 or 10 to optionally include wherein the processor is configured to execute instructions to morph between the at least two graphical representations in substantially real time relative to movement of the user controllable selection tool.

Example 12 can include, or optionally be combined with the subject matter of any one of Example 1-11 to optionally include wherein the user interface includes a touch sensitive display.

Example 13 can include, or optionally be combined with the subject matter of any one of Example 1-12 to optionally include wherein the user input is associated with a proxy feature corresponding to a performance parameter.

Example 14 can include, or optionally be combined with the subject matter of any one of Example 1-13 to optionally include wherein the user input is associated with a heat value, a load value, or a stress value.

Example 15 can include, or optionally be combined with the subject matter of any one of Example 1-14 to optionally include wherein the user input is configured to snap to a value associated with a particular simulation of the plurality of discrete simulations.

Example 16 can include, or optionally be combined with the subject matter of any one of Example 1-15 to optionally include wherein the user interface is configured for manual manipulation of a numeric value.

Example 17 can include, or optionally be combined with the subject matter of any one of Example 1-16 to optionally include wherein the user interface is configured for manual manipulation of a geometric value.

Example 18 can include, or optionally be combined with the subject matter of any one of Example 1-17 to optionally include wherein the user interface is configured for manual manipulation of a face of the device, an edge of the device, or a cutout of the device.

Example 19 can include, or optionally be combined with the subject matter of any one of Example 1-18 to optionally include wherein the plurality of discrete simulations includes simulations associated with finite element analysis.

Example 20 can include, or optionally be combined with the subject matter of any one of Example 1-19 to optionally include wherein the plurality of discrete simulations includes simulations associated with computational fluid dynamics analysis.

Example 21 can include, or optionally be combined with the subject matter of any one of Example 1-20 to optionally include wherein the processor is configured to execute instructions to implement an algorithm to determine a calculated simulation corresponding to interpolation associated with a discrete simulation.

Example 22 can include, or optionally be combined with the subject matter of any one of Example 1-21 to optionally include wherein the processor is configured to execute instructions to implement an algorithm to determine a calculated simulation corresponding to extrapolation associated with a discrete simulation.

Example 23 can include, or optionally be combined with the subject matter of any one of Example 21-22 to optionally include wherein the processor is configured to execute instructions to store the calculated simulation in the memory.

Example 24 can include, or optionally be combined with the subject matter of any one of Example 1-23 to optionally include wherein the processor is configured to execute instructions to implement an as-rigid-as-possible shape deformation algorithm.

Example 25 can include, or optionally be combined with the subject matter of any one of Example 1-24 to optionally include wherein the processor is configured to store a plurality of scalar values associated with a device configuration.

Example 26 can include, or optionally be combined with the subject matter of any one of Example 25 to optionally include wherein each scalar value is represented as a radial distance on a spoke, the spoke having a first value at a hub and a second value at a peripheral location.

Example 27 can include, or optionally be combined with the subject matter of any one of Example 25-26 to optionally include wherein the processor is configured to determine a calculated simulation in which a scalar value associated with a device configuration is allowed to float, to remain fixed, or to modulate according to a predetermined function.

Example 28 can include, or optionally be combined with the subject matter of any one of Example 1-27 to optionally include wherein the user interface is configured to display a plurality of scalar values in alignment along a common axis.

Example 29 can include or use subject matter such as a method that when performed can include or use displaying a first simulated device using a graphical user interface and receiving a user input associated with the simulated device, the user input received using the graphical user interface. The method can include executing instructions using a processor to select a simulation from a plurality of discrete simulations corresponding to the user input. Each simulation can include device design parameters and corresponding performance parameters. The method can include storing data in a memory. The data can be determined by the selected simulation. The method can include displaying a second simulated device using the graphical user interface. The second simulated device can be determined by the selected simulation.

Example 30 can include, or can optionally be combined with the subject matter of Example 29, to optionally include repeating the receiving the user input, repeating the executing instructions, repeating the storing data, and repeating the displaying the second simulated device.

Example 31 can include, or can optionally be combined with the subject matter of one of Example 29 or 30, to optionally include wherein receiving the user input includes receiving a device design parameter.

Example 32 can include, or can optionally be combined with the subject matter of any one of Example 29-31, to optionally include wherein receiving the user input includes receiving a performance parameter.

Example 33 can include, or can optionally be combined with the subject matter of any one of Example 29-32, to optionally include wherein receiving the user input includes receiving an indication of a dragging operation.

Example 34 can include, or can optionally be combined with the subject matter of any one of Example 29-33, to optionally include wherein receiving the user input includes receiving a plurality of simultaneous inputs.

Example 35 can include, or can optionally be combined with the subject matter of any one of Example 29-34, to optionally include wherein executing instructions using the processor includes interpolating using the selected simulation.

Example 36 can include, or can optionally be combined with the subject matter of any one of Example 29-35, to optionally include executing instructions using the processor to identify a candidate simulation. The candidate simulation is different from each simulation in the plurality of discrete simulations. The Example can include executing instructions to determine device design parameters and performance parameters corresponding to the candidate simulation. The Example can include augmenting the plurality of discrete simulations with the candidate simulation.

Example 37 can include, or can optionally be combined with the subject matter of Example 36, to optionally include wherein executing instructions using the processor to identify the candidate simulation includes executing an artificial intelligence algorithm.

Example 38 can include, or can optionally be combined with the subject matter of any one of Example 32, to optionally include wherein receiving the performance parameter includes receiving an input as to a proxy feature associated with the performance parameter.

Example 39 can include, or can optionally be combined with the subject matter of any one of Example 1-38, to optionally include wherein executing instructions using the processor includes calculating a value associated with the selected simulation, the value associated with the device.

Example 40 can include, or can optionally be combined with the subject matter of any one of Example 1-39, to optionally include wherein storing data includes storing a value of a parameter associated with the device, the value having a position on a spoke wherein a hub of the spoke represents a first value and a peripheral location of the spoke represents a second value.

Example 41 can include, or can optionally be combined with the subject matter of any one of Example 40, to optionally include wherein storing data includes storing values for a plurality of parameters.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system comprising:
   a user interface configured to depict a first graphical representation of a device having a first configuration corresponding to a first simulation, the user interface configured to receive a user input corresponding to the device;
   a processor coupled to the user interface, the processor configured to select a second simulation from a plurality of discrete simulations, the second simulation corresponding to the user input;
   a memory coupled to the processor, the memory configured to store the plurality of discrete simulations, each simulation including device design parameters and corresponding performance parameters, the plurality of discrete simulations including the first simulation and including the second simulation, the processor configured to generate a second graphical representation of the device having a second configuration, and the processor configured to depict the second graphical representation using the user interface, the second configuration determined using the second simulation, and wherein the user input is associated with a performance parameter; and
   wherein an inverse design allows a user to enter a drag operation that affects the simulated performance parameters and the system responds by displaying a morph corresponding to the simulation results and wherein the processor calculates a distance metric based on motion of n cursors using a distance function such as $$d(C_i, C_j) = 1.0 - \frac{1}{n}\sum_{x=1}^{n} |\|p'_x - p_x\| \cdot \|w(C_i, C_j, p_x) - p_x\||.$$

2. The system of claim 1 wherein the processor is configured to execute instructions to depict at least two graphical representations of the device in response to receiving the user input associated with a user controllable selection tool and wherein the processor is configured to execute instructions to calculate an interpolated simulation between the at least two graphical representations at a rate determined by the user controllable selection tool and in a direction determined by the user controllable selection tool.

3. The system of claim 1, wherein the processor is configured to execute instructions to depict a plurality of graphical representations, each graphical representation corresponding to a simulation.

4. The system of claim 1, wherein the user input is associated with a device design parameter.

5. The system of claim 1, wherein the processor is configured to execute instructions to identify a simulation based on an earlier user input.

6. The system of claim 1, wherein the processor is configured to execute instructions to implement a shape deformation algorithm.

7. The system of claim 1, wherein the processor is configured to store a time-wise record of device configurations.

8. A method comprising:
   displaying a first simulated device using a graphical user interface;
   receiving a user input associated with the simulated device, the user input received using the graphical user interface, and wherein receiving the user input includes receiving a performance parameter;
   executing instructions using a processor to select a simulation from a plurality of discrete simulations corresponding to the user input, each simulation including device design parameters and corresponding performance parameters, wherein executing instructions includes executing an inverse design in which the user input includes a drag operation that affects a simulated performance parameter and displaying a morph corresponding to simulation results and wherein executing instructions includes calculating a distance metric based on motion of n cursors using a distance function such as $$d(C_i, C_j) = 1.0 - \frac{1}{n}\sum_{x=1}^{n} |\|p'_x - p_x\| \cdot \|w(C_i, C_j, p_x) - p_x\||,$$

storing data in a memory, the data determined by the selected simulation; and
   displaying a second simulated device using the graphical user interface, the second simulated device determined by the selected simulation.

9. The method of claim 8 further including repeating the receiving the user input, repeating the executing instructions, repeating the storing data, and repeating the displaying the second simulated device.

10. The method of claim 8, wherein receiving the user input includes receiving a device design parameter.

11. The method of claim 8, wherein receiving the user input includes receiving an indication of a dragging operation.

12. The method of claim 8, wherein receiving the user input includes receiving a plurality of simultaneous inputs.

13. The method of claim 8, wherein executing instructions using the processor includes interpolating using the selected simulation.

14. The method of claim 8, further comprising:
   executing instructions using the processor to identify a candidate simulation, the candidate simulation different from each simulation in the plurality of discrete simulations;
   executing instructions to determine device design parameters and performance parameters corresponding to the candidate simulation; and
   augmenting the plurality of discrete simulations with the candidate simulation.

15. The method of claim 14 wherein executing instructions using the processor identify the candidate simulation includes executing an artificial intelligence algorithm.

* * * * *

UNITED STATES PATENT AND TRADEMARK OFFICE
CERTIFICATE OF CORRECTION

PATENT NO. : 10,831,936 B2
APPLICATION NO. : 14/389714
DATED : November 10, 2020
INVENTOR(S) : Erdman et al.

Page 1 of 1

It is certified that error appears in the above-identified patent and that said Letters Patent is hereby corrected as shown below:

In the Claims

In Column 24, Line 64, in Claim 15, after "processor", insert --to--

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*